United States Patent
Motoroiu et al.

(10) Patent No.: US 10,250,198 B2
(45) Date of Patent: Apr. 2, 2019

(54) METHODS OF ADJUSTING GAIN ERROR IN INSTRUMENTATION AMPLIFIERS

(71) Applicant: Microchip Technology Incorporated, Chandler, AZ (US)

(72) Inventors: Serban Motoroiu, Campina (RO); Jim Nolan, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/887,199

(22) Filed: Feb. 2, 2018

(65) Prior Publication Data

US 2018/0323748 A1 Nov. 8, 2018

Related U.S. Application Data

(60) Provisional application No. 62/500,448, filed on May 2, 2017.

(51) Int. Cl.
*H03F 1/12* (2006.01)
*H03F 3/45* (2006.01)
(Continued)

(52) U.S. Cl.
CPC .............. *H03F 1/12* (2013.01); *H03F 1/342* (2013.01); *H03F 3/45179* (2013.01); *H03F 3/45183* (2013.01); *H03F 3/45672* (2013.01); *H03G 1/0023* (2013.01); *H03G 1/0029* (2013.01); *H03G 1/0088* (2013.01);
(Continued)

(58) Field of Classification Search
None
See application file for complete search history.

(56) References Cited

U.S. PATENT DOCUMENTS

| | | | |
|---|---|---|---|
| 6,509,795 B1 | 1/2003 | Ivanov | 330/253 |
| 6,859,095 B2 | 2/2005 | Nandy et al. | 330/9 |
| 2010/0329157 A1 | 12/2010 | Xing et al. | 370/278 |

OTHER PUBLICATIONS

Jaworski, Zbigniew, "A Fully Differential OTA with Dynamic Offset Cancellation in 28 nm FD-SOI Process," Proceedings of the SPIE—Smart Structures and Materials 2005: Smart Electronics, MEMS, Biomens and Nanotechnology Proceedings of the SPIE, vol. 10175, 9 pages, Dec. 22, 2016.

(Continued)

*Primary Examiner* — Patricia T Nguyen
(74) *Attorney, Agent, or Firm* — Slayden Grubert Beard PLLC (57) ABSTRACT

A current feed-back instrumentation amplifier (CFIA) comprises a differential pair with degeneration for amplifying small differential voltages in the presence of large common-mode voltages. The CFIA includes input and feedback transconductors and a trimming circuit that trims the back-bias voltages of the transistors in each transconductor. The trimming circuit includes a plurality of selectable resistors disposed in the signal path of the tail current in each transconductor. Each of the plurality of selectable resistors has a switch coupled to it. When a switch is closed, only the resistors up to the respective switch are in the signal path of the bulk-to-source voltage of the differentially paired transistors. The resistor trimming circuit reduces the mismatch between transconductances of the respective differential pair transistors, in turn reducing mismatch of the overall transconductances of the transconductors, and thereby reducing the CFIA's gain error.

19 Claims, 9 Drawing Sheets

(51) Int. Cl.
*H03F 1/34* (2006.01)
*H03G 1/00* (2006.01)

(52) U.S. Cl.
CPC .. *H03F 2200/258* (2013.01); *H03F 2200/261* (2013.01); *H03F 2203/45048* (2013.01); *H03F 2203/45138* (2013.01); *H03F 2203/45341* (2013.01); *H03F 2203/45342* (2013.01); *H03F 2203/45466* (2013.01); *H03F 2203/45494* (2013.01); *H03F 2203/45504* (2013.01); *H03F 2203/45511* (2013.01); *H03F 2203/45521* (2013.01)

(56) References Cited

OTHER PUBLICATIONS

International Search Report and Written Opinion, Application No. PCT/US2018/029715, 14 pages, dated Jul. 16, 2018.

METHODS OF ADJUSTING GAIN ERROR IN INSTRUMENTATION AMPLIFIERS

RELATED PATENT APPLICATION

This application claims priority to commonly owned U.S. Provisional Patent Application No. 62/500,448; filed May 2, 2017; which is hereby incorporated by reference herein for all purposes.

TECHNICAL FIELD

In accordance with some embodiments of the disclosed subject matter, systems and methods are provided for dynamically correcting the gain error of an instrumentation amplifier that uses a current-feedback circuit architecture.

BACKGROUND

Figure 1:
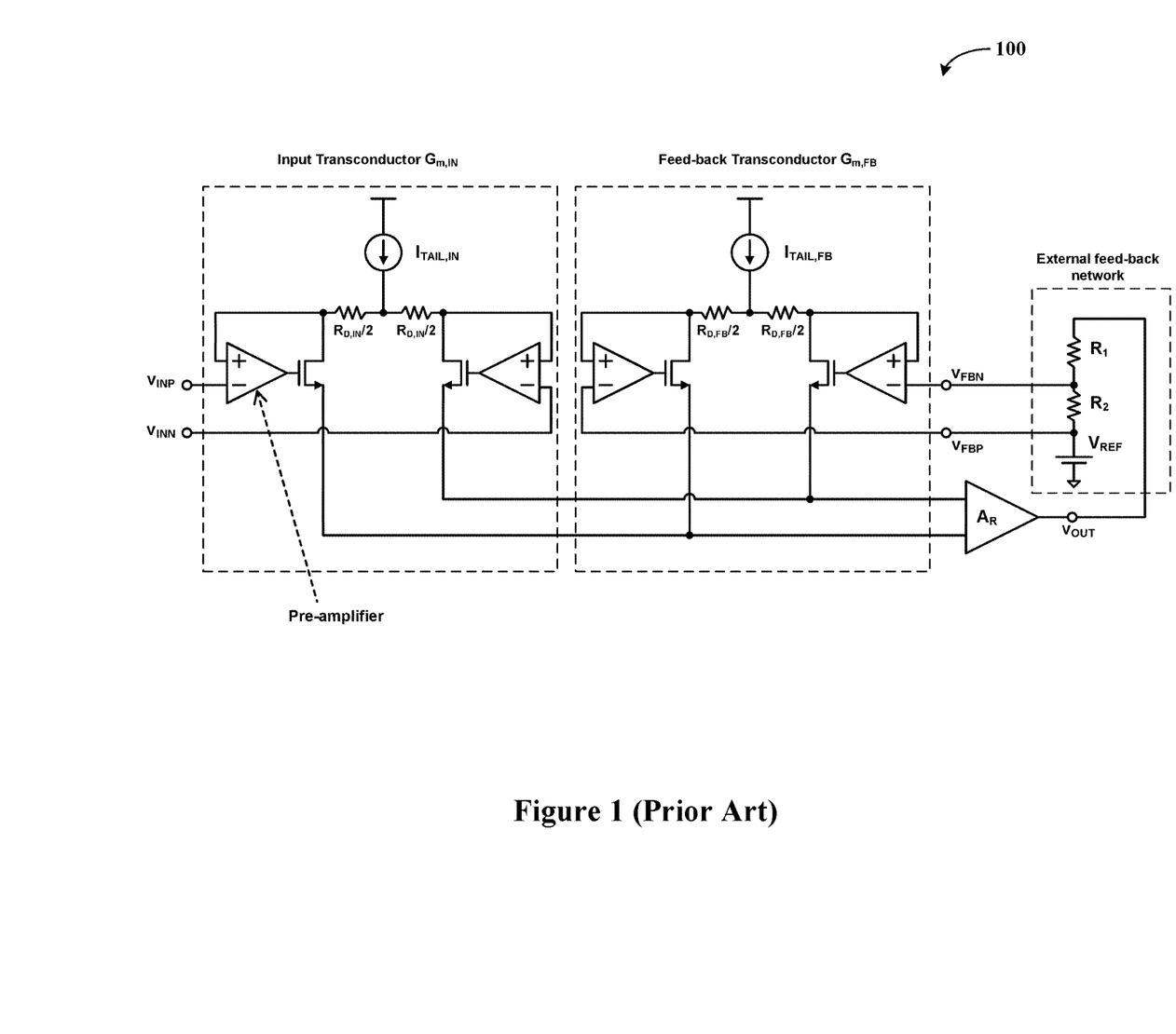
FIG. 1 illustrates a schematic diagram of a prior art current-feedback instrumentation amplifier that uses preamplifiers.

The gain error, e.g., the difference between the actual transfer function and an ideal transfer function of a current feed-back instrumentation amplifier (CFIA) depends on the accuracy of matching between the CFIA's input transconductor and feedback transconductor. Some existing CFIAs try to address the gain error using an architecture in which each transconductor includes pre-amplifiers to create a transfer function proportional to the ratio between the degeneration resistors of the input and feedback transconductors, see FIG. 1. The advantage of this circuit architecture is that it provides a gain error that depends almost exclusively on matching of resistors which is superior to the matching of transistors. While the preamplifiers provide an overall low gain error, their noise adds to the total noise of the instrumentation amplifier, making this architecture less suitable for low noise designs. Another disadvantage is the presence of feedback loops around each pre-amplifier, which makes frequency compensation rather complex and difficult.

In another approach, the CFIA's transconductors are each based on a differential pair of transistors with degeneration. The noise is significantly lower than the solution that uses preamplifiers, and there will be no extra feedback loops. However, the gain error will also change: it will now be affected not only by the mismatch between the input and feedback degeneration resistors, but also by any mismatch between the degenerated differential paired transistors of each transconductor, and by any mismatch between the respective tail currents being fed into each transconductor. As noted above, resistors match much better than transistors do, so mismatches other than the mismatch between the degeneration resistors dominate the gain error.

SUMMARY

Therefore, what is needed is a CFIA having an architecture that minimizes the mismatch between other elements of the input and feedback transconductors, such as the transistors and/or the tail currents.

According to an embodiment, a method for gain error correction in a current-feedback instrumentation amplifier may comprise the steps of: providing an input transconductor comprising a first differential pair of transistors, a first tail current source, and a first trimming circuit coupled between the first tail current source and the first differential pair of transistors, and to a bulk of the first differential pair of transistors, wherein the first trimming circuit may vary a first back-bias voltage on the bulk of the first differential pair of transistors; providing a feedback transconductor comprising a second differential pair of transistors, a second tail current source, and a second trimming circuit coupled between the second tail current source and the second differential pair of transistors, and to a bulk of the second differential pair of transistors; wherein the second trimming circuit may vary a second back-bias voltage on the bulk of the second differential pair of transistors; and adjusting the first and/or second trimming circuits to reduce gain error between the input transconductor and feedback transconductor.

According to a further embodiment of the method, may comprise the steps of: providing first degeneration resistors coupled between the first differential pair of transistors and the first trimming circuit; and providing second degeneration resistors coupled between the second differential pair of transistors and the second trimming circuit. According to a further embodiment of the method, the first and second trimming circuits may comprise a plurality of series connected resistors and a plurality of switches coupled to the plurality of series connected resistors, whereby the first and second back-bias voltages may be varied. According to a further embodiment of the method, may comprise the step of storing open and closed states of the plurality of switches in a non-volatile memory. According to a further embodiment of the method, may comprise the step of coupling the input and feedback transconductors to an amplifier.

According to a further embodiment of the method, may comprise the steps of: coupling a feedback network between an output of the amplifier and inputs of the feedback transconductor; and determining the current-feedback instrumentation amplifier gain with the feedback network. According to a further embodiment of the method, may comprise the steps of: providing a modulator circuit between the first and second tail current sources, and the first and second trimming circuits; controlling the modulator circuit by alternating first and second phase states; wherein during the first phase state the modulator circuit couples the first tail current source to the first trimming circuit and the second tail current source to the second trimming circuit, and during the second phase state the modulator circuit couples the first tail current source to the second trimming circuit, and the second tail current source to the first trimming circuit.

According to another embodiment, a current-feedback instrumentation amplifier having gain error correction may comprise: an input transconductor that may comprise a first differential pair of transistors, a first tail current source, and a first trimming circuit that may be coupled between the first tail current source and the first differential pair of transistors, and to a bulk of the first differential pair of transistors; wherein the first trimming circuit may be configured to vary a first back-bias voltage on the bulk of the first differential pair of transistors; a feedback transconductor that may comprise a second differential pair of transistors, a second tail current source, and a second trimming circuit that may be coupled between the second tail current source and the second differential pair of transistors, and to a bulk of the second differential pair of transistors; wherein the second trimming circuit may be configured to vary a second back-bias voltage on the bulk of the second differential pair of transistors; and the first and/or second trimming circuits may be adapted to be adjusted to reduce gain error between the input transconductor and feedback transconductor.

According to a further embodiment, the first degeneration resistors may be coupled between the first differential pair of transistors and the first trimming circuit; and second degeneration resistors may be coupled between the second differential pair of transistors and the second trimming circuit.

According to a further embodiment, the first and second trimming circuits may comprise a plurality of series connected resistors and a plurality of switches coupled to the plurality of series connected resistors, wherein the plurality of resistors and switches may be adapted to vary the first and second back-bias voltages. According to a further embodiment, a non-volatile memory may be adapted for storing open and closed states of the plurality of switches According to a further embodiment, an amplifier may have inputs thereof coupled to outputs from the input and feedback transconductors. According to a further embodiment, a feedback network may be coupled between an output of the amplifier and inputs of the feedback transconductor.

According to a further embodiment, the feedback network may comprise: a first feedback resistor; a second feedback resistor; and a voltage reference; wherein the first and second feedback resistors and the voltage reference may be connected in series, a first input of the feedback transconductor may be coupled to a node between the second feedback resistor and the voltage reference, a second input of the feedback transconductor may be coupled to a node between the first feedback resistor and the second feedback resistor, and the output of the amplifier may be coupled to the first feedback resistor; wherein gain may be determined by a ratio of resistance values of the first and second feedback resistors.

According to a further embodiment, a modulator circuit may be coupled between the first and second tail current sources, and the first and second trimming circuits, wherein the modulator circuit may be adapted to alternate between first and second phase states; wherein during the first phase state the modulator circuit may be adapted to couple the first tail current source to the first trimming circuit and the second tail current source to the second trimming circuit; and wherein during the second phase state the modulator circuit may be adapted to couple the first tail current source to the second trimming circuit, and the second tail current source to the first trimming circuit.

According to a further embodiment, the modulator circuit may comprise: a first switch coupled between the first tail current source and the first degeneration resistors; a second switch coupled between the first tail current source and the second degeneration resistors; a third switch coupled between the second tail current source and the first degeneration resistors; and a fourth switch coupled between the second tail current source and the second degeneration resistors; wherein the first and fourth switches may be configured to close and the second and third switches may be configured to open on a first phase state control signal; and the second and third switches may be configured to close and the first and fourth switches may be configured to open on a second phase state control signal.

According to a further embodiment, the first and second phase state control signals may be from a clock generator, wherein the first phase state control signal may be at a first logic level and the second phase state control signal may be at a second logic level. According to a further embodiment, the first, second, third and fourth switches may be metal oxide semiconductor field effect transistors (MOSFETs). According to a further embodiment, the input and feedback transconductors may be fabricated on an integrated circuit die.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

DETAILED DESCRIPTION

In accordance with some embodiments of the disclosed subject matter, the present disclosure provides a Current Feed-back Instrumentation Amplifier (CFIA) fabricated on an integrated circuit die and comprising a circuit architecture that is based on a differential pair with degeneration. The present CFIA includes a trimming circuit that trims the back-bias voltages of the transistors in each transconductor. The trimming circuit may include a plurality of selectable resistors disposed in the signal path of the tail current in each transconductor. Each of the plurality of selectable resistors has a switch coupled to it. The switches in each transconductor are controlled in such a way that only one switch is closed at a time, the rest remaining open. When a switch is closed, only the resistors up to the respective switch are in the signal path of the bulk-to-source voltage of the differentially paired transistors. The closed resistance of the switch is much less than the input resistance value into the bulk terminals of the differentially paired transistors and does not affect the signal path from the selectable resistors to the bulks.

A non-volatile memory (not shown) may be used to remember the open and closed switch configurations. The resistor trimming circuit reduces the mismatch between transconductances of the respective differential pair transistors, in turn reducing mismatch of the overall transconductances of the transconductors, and thereby reducing the CFIA's gain error. The resistor trimming circuit may also be used in conjunction with a tail current modulator circuit architecture designed to eliminate the contribution of tail current mismatch to the overall gain error, and further reduce the gain error.

The present disclosure is directed toward an architecture for a CFIA comprising differential transistor pairs with degeneration for amplifying small differential voltages in the presence of large common-mode voltages. The present CFIA circuit architecture employs trimming of a target voltage, specifically the back-bias voltage, $V_{BS}$, that is inherent in any metal oxide semiconductor (MOS) transistor operating in a sub-threshold region. It is contemplated and within the scope of this disclosure that this invention is not limited to just the sub-threshold region, e.g., it is equally valid for transistors operating in the saturation region. The back-bias voltage is a contributor to one of the factors that affects the transconductance $g_m$ of a particular transistor; as shown below, trimming the back-bias voltage of each MOS transistor, e.g., P-channel or N-channel MOS field effect transistor (MOSFET), in the respective transconductors reduces mismatch between the transconductances of the respective MOS transistors. In various embodiments, the back-bias voltage is trimmed using a signal voltage fed from a variable resistor comprising a selectable plurality of resistors of a switched resistor network and disposed in the tail current signal path of each transconductor.

Referring now to the drawings, the details of example embodiments are schematically illustrated. Like elements in the drawings will be represented by like numbers, and similar elements will be represented by like numbers with a different lower-case letter suffix.

Figure 1A:
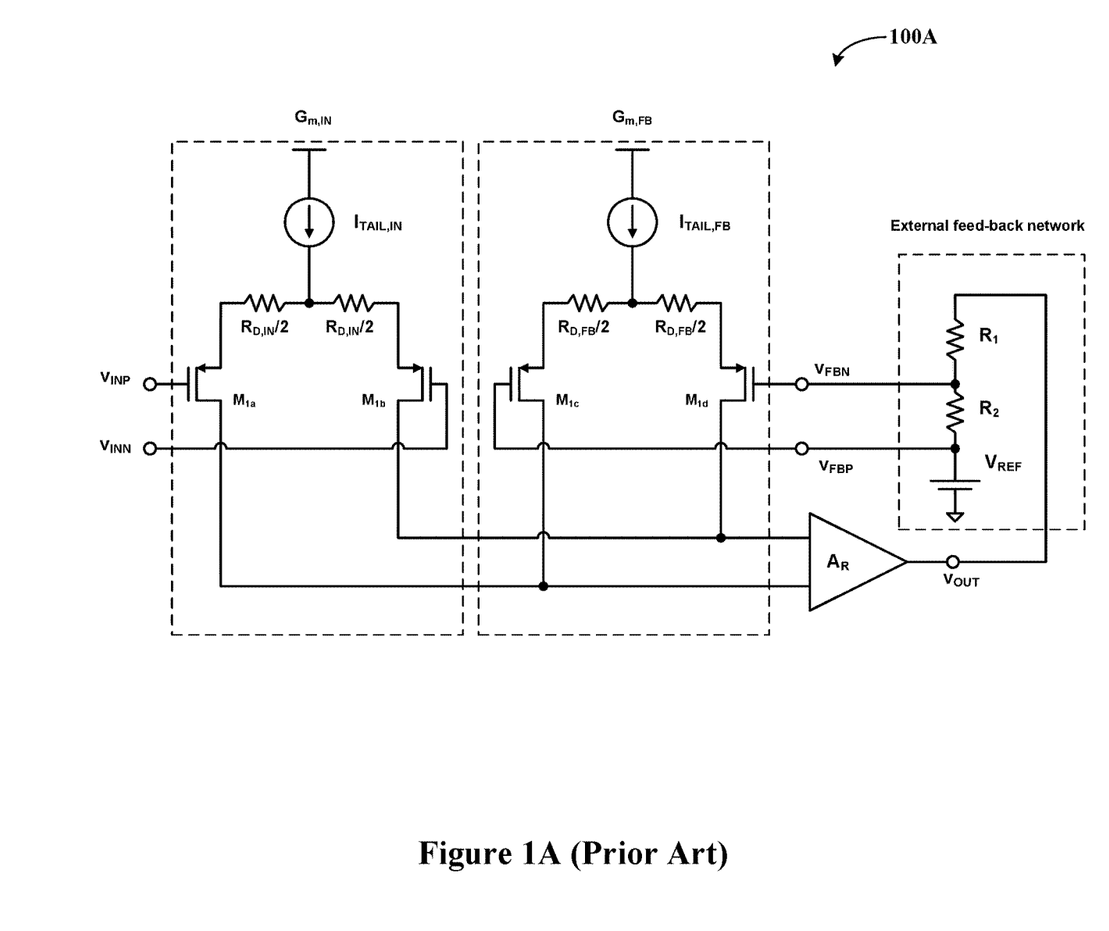
FIG. 1A illustrates a schematic diagram of a prior art current-feedback instrumentation amplifier.

Referring now to FIG. 1A, depicted is a schematic diagram of a prior art current-feedback instrumentation amplifier. An example current-feedback instrumentation amplifier (CFIA), generally represented by the numeral 100A, may use a differential pair with degeneration architecture. The CFIA 100 includes an input transconductor $G_{m,IN}$ that operates on differential input voltages $V_{INP}$ and $V_{INN}$, and a feedback transconductor $G_{m,FB}$ that operates on feedback voltages $V_{FBN}$ and $V_{FBP}$. Each transconductor ($G_{m,IN}$ and $G_{m,FB}$) has a respective tail current $I_{TAIL}$ source. Each transconductor ($G_{m,IN}$ and $G_{m,FB}$) includes degeneration resistors $R_D$, a first pair of transistors $M_{1a}$ and $M_{1b}$ (for $G_{m,IN}$), and a second pair of transistors $M_{1c}$ and $M_{1d}$ (for $G_{m,FB}$). Both transconductors ($G_{m,IN}$ and $G_{m,FB}$) are coupled together and output a signal to an amplifier $A_R$ as shown in FIG. 1A.

Generally, the gain error is given by the ratio between $G_{m,IN}$ and $G_{m,FB}$. Gain error=$G_{m,IN}/G_{m,FB}-1$, where it is assumed the matching between the external resistors $R_1$ and $R_2$ is much better than the match between $G_{m,IN}$ and $G_{m,FB}$. For the CFIA 200, $$G_{m,IN} = \frac{g_{m1ab}}{2+g_{m1ab}R_{D,IN}} \text{ and } G_{m,FB} = \frac{g_{m1cd}}{2+g_{m1cd}R_{D,FB}},$$

where $g_{m1ab}$ is the transconductance of transistors $M_{1a}$ and $M_{1b}$, and $g_{m1cd}$ is the transconductance of transistors $M_{1b}$ and $M_{1d}$, and $R_{D,IN}$ and $R_{D,FB}$ have already been defined above. For simplicity, it is assumed there is no mismatch between $M_{1a}$ and $M_{1b}$ and they have the same transconductance, $g_{m1ab}$. Likewise, it is assumed there is no mismatch between $M_{1c}$ and $M_{1d}$ and they have the same transconductance $g_{m1cd}$. For convenience, one usually chooses $g_{m1ab}=g_{m1cd}$, and $R_{D,IN}=R_{D,FB}$, such that the ratio $G_{m,IN}/G_{m,FB}$ may be unity. For transistors operating in the sub-threshold region $$g_{m1ab} = \frac{I_{TAIL,IN}}{2n_{ab}V_{T,ab}} \text{ and } g_{m1ab} = \frac{I_{TAIL,FB}}{2n_{cd}V_{T,cd}},$$

where $I_{TAIL,IN}$ and $I_{TAIL,FB}$ are the tail currents of $G_{m,IN}$ and $G_{m,FB}$, respectively; $n_{ab}$ and $n_{cd}$ are the sub-threshold constants of transistors $M_{1a}$ and $M_{1b}$, and $M_{1c}$ and $M_{1d}$, respectively; and $V_{T,ab}$ and $V_{T,cd}$ the thermal voltages of $M_{1a}$ and $M_{1b}$, and $M_{1c}$ and $M_{1d}$, respectively. The gain error will therefore depend on the matching between $R_{D,IN}$ and $R_{D,FB}$, $I_{TAIL,IN}$ and $I_{TAIL,FB}$, $n_{ab}$ and $n_{cd}$, and $V_{T,ab}$ and $V_{T,cd}$. In the ideal case, $R_{D,IN}=R_{D,FB}$, $I_{TAIL,IN}=I_{TAIL,FB}$, $n_{ab}=n_{cd}$, $V_{T,ab}=V_{T,cd}$, and the gain error is zero. This disclosure particularly addresses the contribution of the mismatch between $n_{ab}$ and $n_{cd}$ to the overall gain error.

It can be shown that the sub-threshold factor, n, for a MOS transistor depends on the back-bias (bulk-to-source) voltage of the transistor. The factor n is a function of the capacitances of the transistor: $n=1+(C_{bulk}/C_{ox})$, where $C_{ox}$ is the gate oxide capacitance and $C_{bulk}$ is the capacitance of the depletion region around a constant source diffusion. $C_{bulk}$ is inversely proportional to the depletion region width, $w_d$, where $C_{bulk}=\varepsilon_{Si}/w_d$. The depletion region width, $w_d$, is, in turn, proportional to the back-bias (also known as "body bias") voltage $V_{BS}$ present at the back gate of the transistor:

$$w_d = \text{depletion region width} = \sqrt{\frac{2\varepsilon_{Si}(2\Psi_B + V_{BS})}{qN_A}}$$

where $\varepsilon_{Si}$ is the permittivity of silicon, $\Psi_{PB}$ is the Fermi potential, and NA is the bulk concentration in the transistor material. Thus, the sub-threshold factor n is inversely proportional to the back-bias voltage $V_{BS}$, which means $g_{m1ab}$ is directly proportional to $V_{BSab}$ (of transistors $M_{1a}$ and $M_{1b}$), and $g_{m1cd}$ is directly proportional to $V_{BScd}$ (of transistors $M_{1c}$ and $M_{1d}$). Furthermore, it can be assumed that the other parameters that make up the factor n are relatively constant between transistors, such that matching $V_{BS}$ across transistors will cause the transistors' transconductances, $g_{m1ab}$ and $g_{m1cd}$, to match as well.

Figure 2:
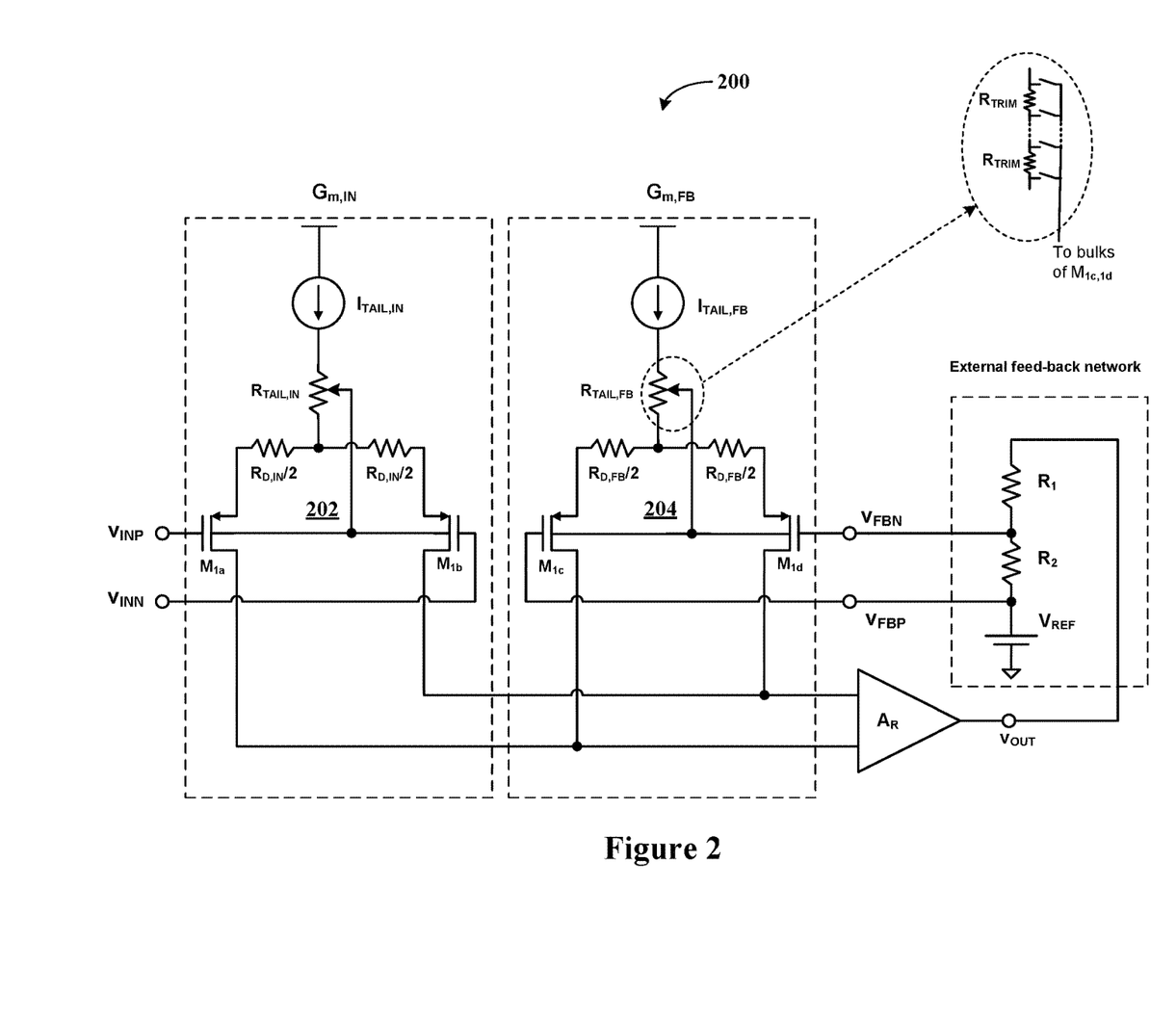
FIG. 2 illustrates a schematic diagram of a current-feedback instrumentation amplifier with a back-bias voltage trimming circuit, according to a specific example embodiment of the present disclosure.

Referring now to FIG. 2, depicted is a schematic diagram of a current-feedback instrumentation amplifier with a back-bias voltage trimming circuit, according to a specific example embodiment of the present disclosure. A CFIA, generally represented by the numeral 200, may use back-bias voltage trimming circuits to minimize or substantially eliminate the contribution of mismatched transistor transconductances to the gain error of the CFIA 200. In some embodiments, the CFIA 200 may comprise the CFIA 100 architecture shown in FIG. 1 and a trimming circuit 202, 204 in each transconductor $G_{m,IN}$, $G_{m,FB}$, respectively. The trimming circuits 202, 204 connect the bulks or "bodies" of the transistors ($M_{1a}$, $M_{1b}$) and ($M_{1c}$, $M_{1d}$) in each differential pair (e.g., through the bulk or "body" terminal of the transistor) to variable resistors $R_{TAIL,IN}$ and $R_{TAIL,FB}$, respectively, that are disposed in the signal paths of the tail currents $I_{TAIL,IN}$ and $I_{TAIL,FB}$, respectively. The variable resistors $R_{TAIL,IN}$ and $R_{TAIL,FB}$ thereby serve as bias networks to which the transistor bodies $M_{1a}$ and $M_{1b}$, and $M_{1c}$ and $M_{1d}$, respectively, are connected, rather than being connected to power or ground. In some embodiments, the variable resistor $R_{TAIL}$ may be a plurality of series-connected resistors $R_{TRIM}$ that are connected to the tail current source. The trimming circuits 202, 204 are thus one way to obtain a variable bulk-to-source voltage: the bulks of transistors $M_{1a}$ and $M_{1b}$, and $M_{1c}$ and $M_{1d}$; are connected to the 'center tap' (represented by an arrow) of the variable resistors $R_{TAIL,IN}$ and $R_{TAIL,FB}$, respectively, placed in series with the tail currents of the input and feedback transconductors. In the architecture shown in FIG. 2, $V_{BSab}=I_{TAIL,IN}*R_{TAIL,IN}*R_{D,IN}/4)$ and $V_{BScd}=I_{TAIL,FB}*R_{TAIL,FB} (I_{TAIL,FB}*R_{D,FB}/4)$.

Figure 2A:
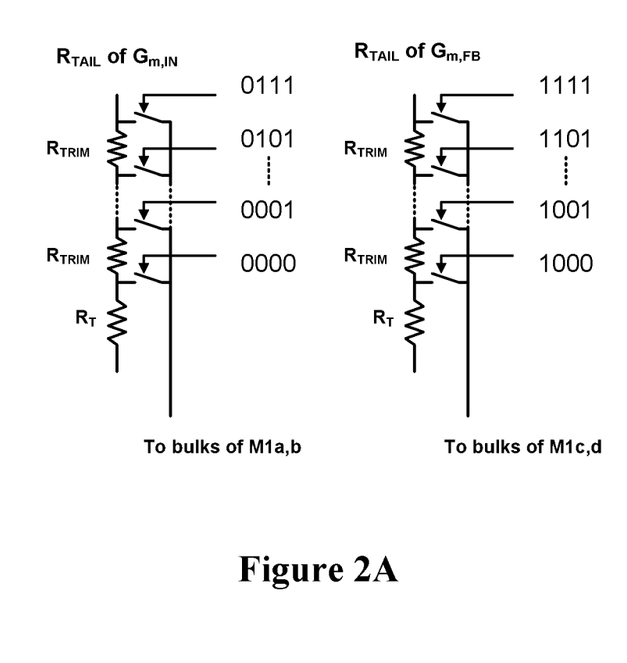
FIGS. 2A and 2B illustrate schematic diagrams of trim resistor and switching arrangements for current-feedback instrumentation amplifier shown in FIG. 2, according to specific example embodiments of the present disclosure.
Figure 2B:
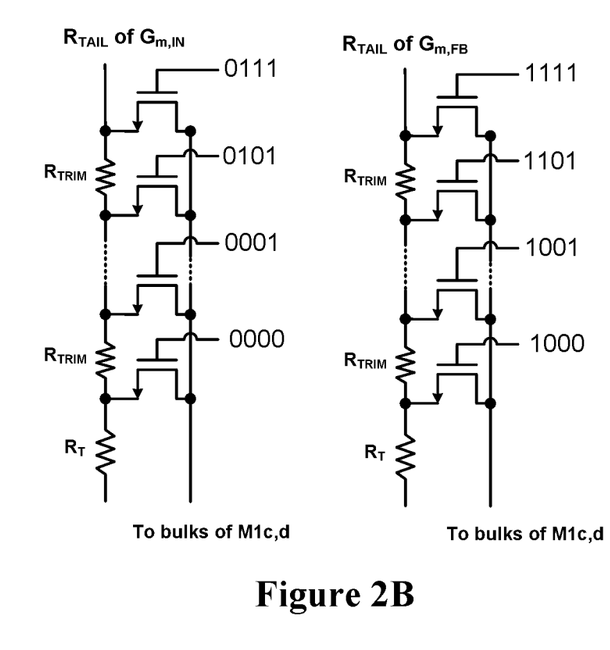

Referring to FIGS. 2A and 2B, depicted are schematic diagrams of trim resistor and switching arrangements for current-feedback instrumentation amplifier shown in FIG. 2, according to specific example embodiments of the present disclosure. The variable resistor $R_{TAIL}$ may comprise a plurality of series coupled $R_{TRIM}$ resistors and corresponding switches. The $R_{TRIM}$ resistors may be series coupled between the tail current source and the bulks of the transistors. A corresponding switch when closed will connect the associated $R_{TRIM}$ resistor to the bulks of the differentially paired transistors, altering their back-bias voltage. When the corresponding switch is open the associated $R_{TRIM}$ resistor will no longer be part of the variable resistor $R_{TAIL}$. The switches may comprise MOS transistors as shown in FIG. 2B.

An open and close pattern for the switches may be stored in a memory module (not shown), such as, for example but is not limited to, an 8-bit memory module. The memory module may comprise a non-volatile memory cell. Thus, the position (resistance) of the center tap may be set by means of the switches controlled by a digital code and stored in a non-volatile memory.

For instance, if due to random mismatch $G_{m,IN}<G_{m,FB}$, the gain error is measured lower than 0; increasing the $V_{BS}$ of transistors $M_{1a}$ and $M_{1b}$ will lead to an increase in their $g_m$, and consequently in $G_{m,IN}$. This is obtained by moving the tap of the input transconductor's $R_{TAIL}$ upwards, in other words switching on a switch of a higher code. If on the other hand, the gain error is measured higher than 0 (the case where $G_{m,IN}>G_{m,FB}$), $V_{BS}$ of $M_{1c}$ and $M_{1d}$ needs to be increased until $G_{m,FB}$ becomes equal to $G_{m,IN}$ (and the gain error is 0). The center tap of the feedback transconductor's $R_{TAIL}$ will need to move upwards. In the example shown here the trimming code has 4 bits, and the value of each resistor $R_{TRIM}$ can only be adjusted upwards; if MSB=0 the resistor of $G_{m,IN}$ is increased until $G_{m,IN}=G_{m,FB}$; if MSB=1 the resistor of $G_{m,FB}$ is increased until $G_{m,FB}=G_{m,IN}$. One advantage of this method is the fact the MOS switches are arranged in such a way that when a switch is ON, its channel resistance (non-linear and process-variable) is negligible because it's in series with a high impedance node, the bulks of the differentially connected transistors.

Figure 2C:
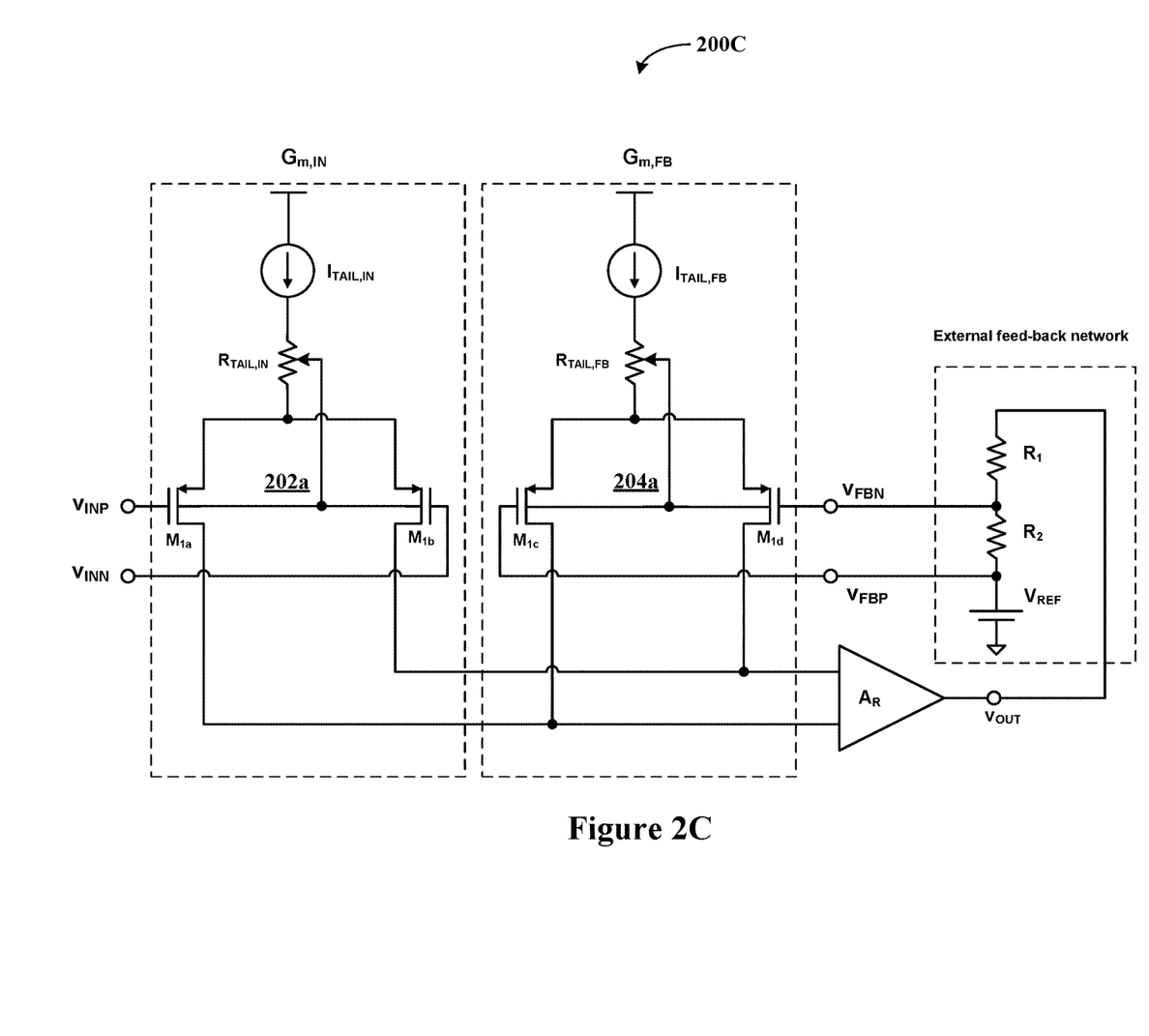
FIG. 2C illustrates a schematic diagram of a current-feedback instrumentation amplifier without degeneration resistors and comprising a back-bias voltage trimming circuit, according to another specific example embodiment of this disclosure.

Referring to FIG. 2C, depicted is a schematic diagram of a current-feedback instrumentation amplifier without degeneration resistors and comprising a back-bias voltage trimming circuit, according to still another specific example embodiment of this disclosure. A back-bias voltage trimming circuit may be effectively used to minimize or substantially eliminate the contribution of mismatched transistor transconductances to the gain error of the CFIA 200C even without the degeneration resistors used in the CFIAs 200, 300 and 400. The CFIA 200C shown in FIG. 2C operates in substantially the same fashion as the CFIA 200 described hereinabove, but is configured without degeneration resistors $R_D$ (FIG. 2).

Figure 3:
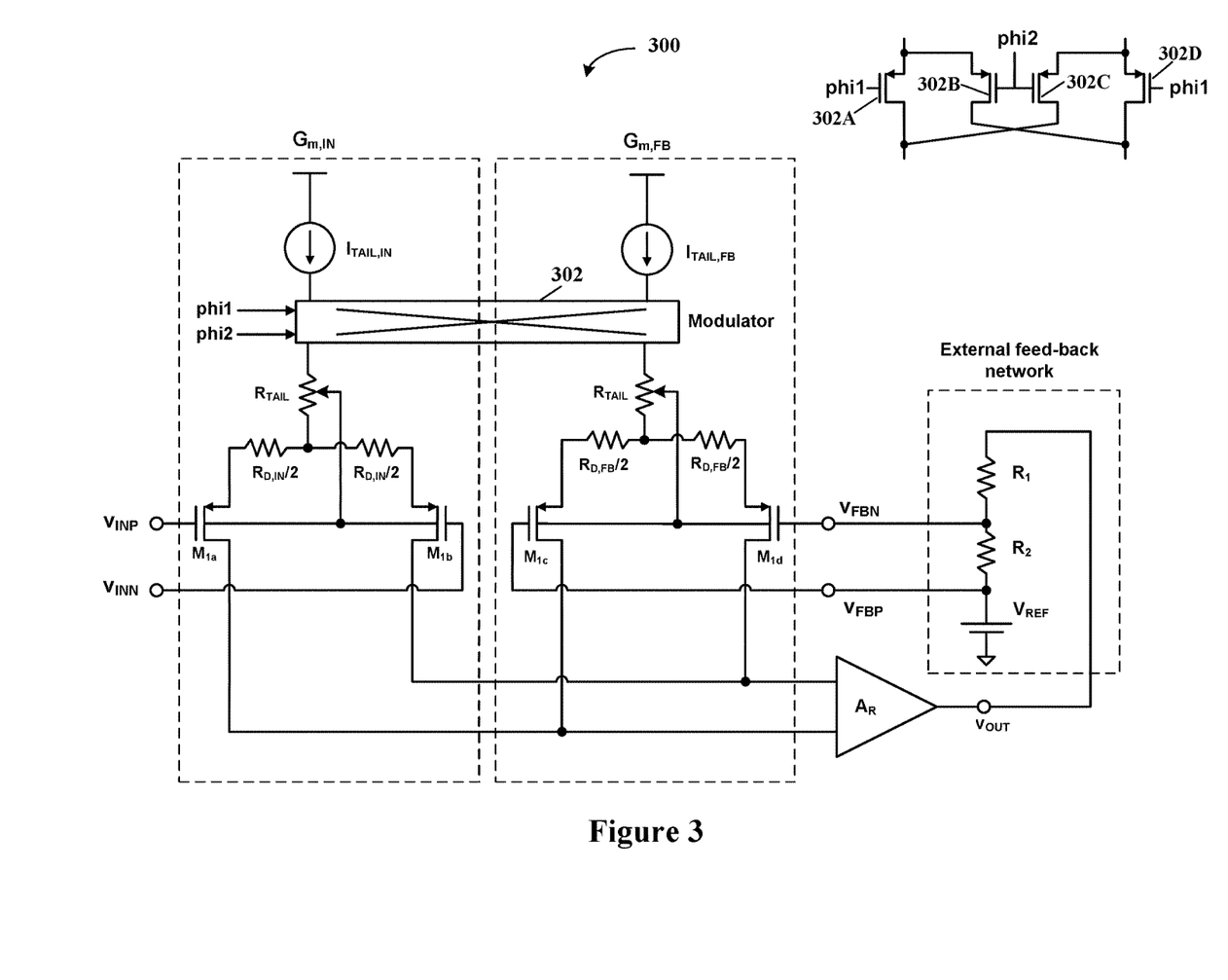
FIG. 3 illustrates a schematic diagram of a current-feedback instrumentation amplifier according to the circuit architecture of FIG. 2 and further comprising a tail current source modulator circuit, according to yet another specific example embodiment of the present disclosure.

Referring now to FIG. 3, depicted is a schematic diagram of a current-feedback instrumentation amplifier according to the circuit architecture of FIG. 2 and further comprising a tail current source modulator circuit, according to another specific example embodiment of the present disclosure. The circuit architecture shown in FIG. 2 may be combined with an additional error-reducing circuit architecture that employs dynamic correction (e.g., "chopping") of the tail current sources for each transconductor to average out the tail current values in each transconductor, thereby reducing mismatch and improving overall gain error and linearity. A CFIA, generally represented by the numeral 300, may comprise the CFIA 200 circuit architecture shown in FIG. 2 and a modulator circuit 302 disposed between the tail current sources $I_{TAIL,IN}$ and $I_{TAIL,FB}$ and the $R_{TAIL}$ resistors. The modulator circuit 302 implements dynamic correction of the tail current mismatch by periodically swapping tail current sources $I_{TAIL,IN}$ and $I_{TAIL,FB}$ to minimize or eliminate the contribution of mismatched currents to the CFIA gain error. This is in addition to the reduction of gain error by trimming the back-bias voltages, as disclosed hereinabove. In some embodiments, the modulator circuit 302 may operate based on input received as one or more regulated signals phi1 and phi2, e.g., provided by a clock or another regulating circuit. In an example implementation, the regulated signals phi1 and phi2 alternately switch between low and high logic levels every half clock cycle, swapping the tail current sources between transconductors $G_{m,IN}$ and $G_{m,FB}$ twice every clock cycle.

The modulator circuit 302 implements dynamic correction of the tail current mismatch by periodically swapping tail currents: during one period the tail current $I_{TAIL,IN}$ flows into the input transconductor and the tail current $I_{TAIL,FB}$ flows into the feedback transconductor, then the modulator circuit 302 switches the tail currents, and during the next period the current $I_{TAIL,IN}$ flows into the feedback transconductor and the tail current $I_{TAIL,FB}$ flows into the input transconductor. In some embodiments, the modulator circuit 302 may operate based on input received as one or more regulated signals phi1, phi2 provided by a clock or another regulating circuit. In an example implementation, the regulated signals phi1, phi2 switch between high and low logic levels every half clock cycle, swapping the tail currents between transconductors twice every clock cycle. Over a complete clock cycle the tail current that flows into the input transconductor is on average equal to the tail current that flows into the feedback transconductor. This approach allows the portion of the gain error contributed by mismatched tail currents to be continuously corrected during operation of the CFIA 300.

Figure 3A:
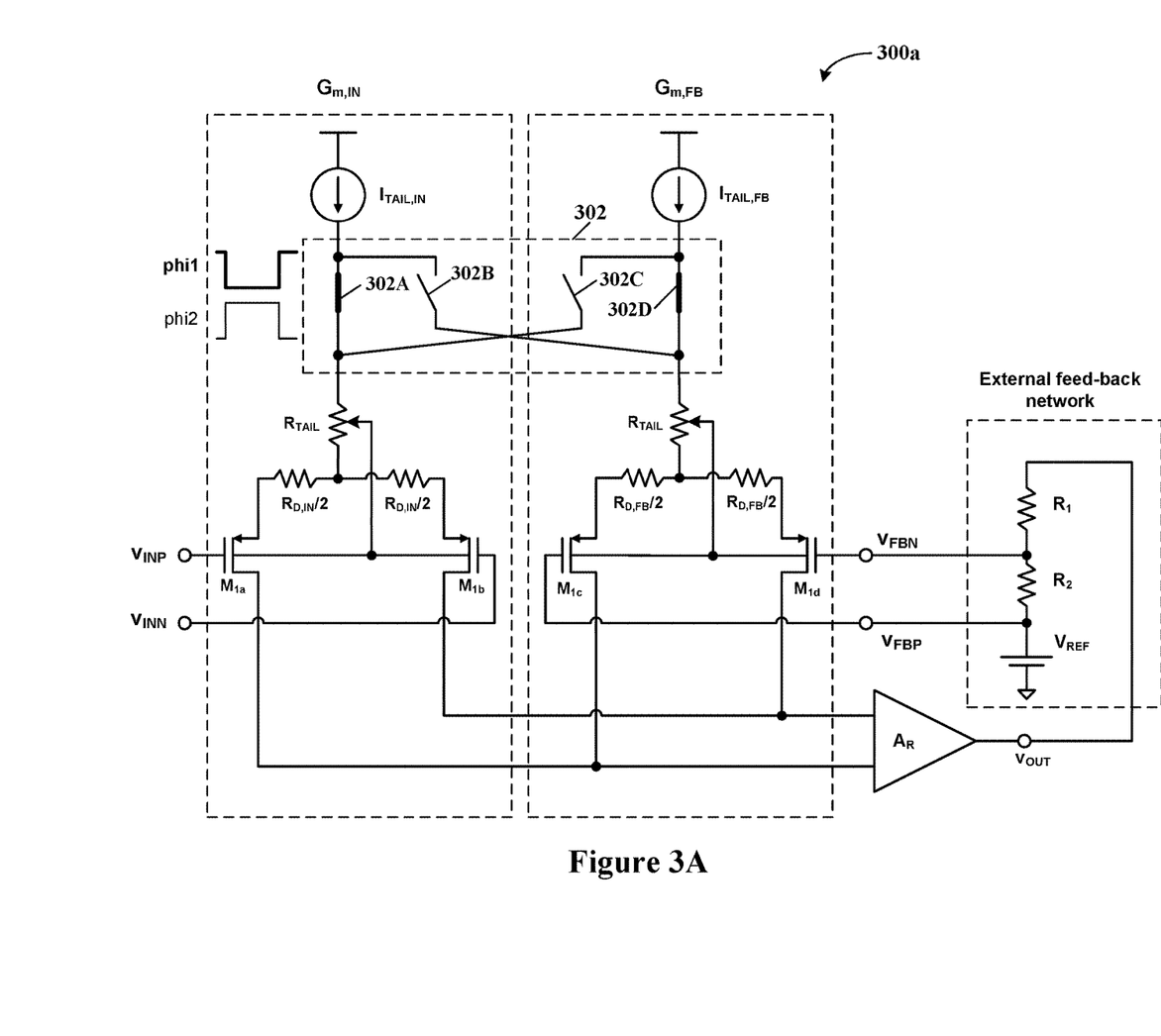
FIG. 3A illustrates a schematic diagram of the current-feedback instrumentation amplifier shown in FIG. 3 in a first phase state.
Figure 3B:
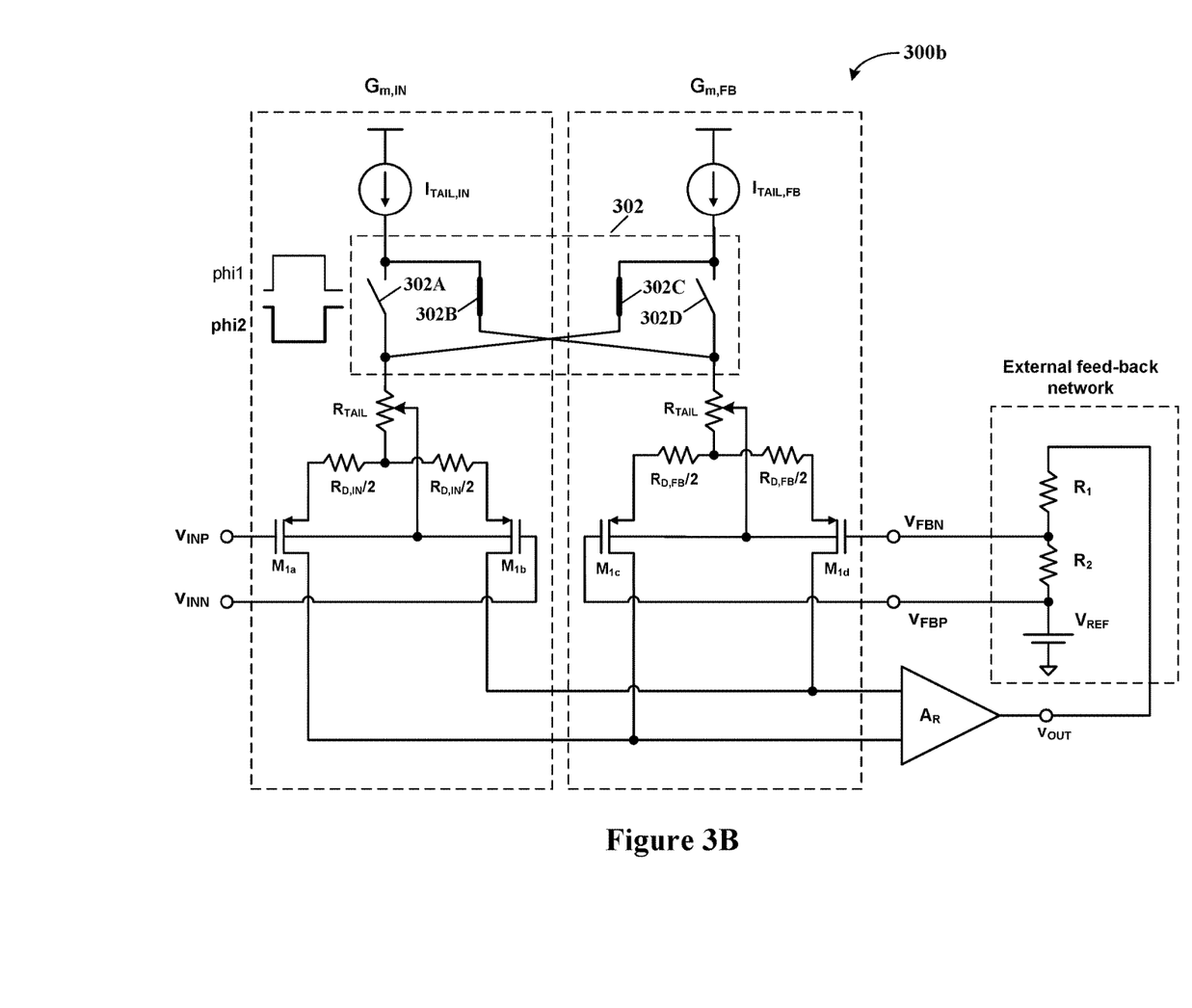
FIG. 3B illustrates a schematic diagram of the current-feedback instrumentation amplifier shown in FIG. 3 in a second phase state.

Referring to FIGS. 3A and 3B, depicted are schematic diagrams of the current-feedback instrumentation amplifier shown in FIG. 3 in first and second phase states, respectively. The modulator circuit 302 of FIG. 3, may include four switches 302A-302D that may be adapted to alternately connect each tail current, $I_{TAIL,IN}$ and $I_{TAIL,FB}$, in the transconductors $G_{m,IN}$ and $G_{m,FB}$. The regulated signals phi1 and phi2 may be provided from a clock signal and are shown to be in opposite phase, such that phi1 is low when phi2 is high, and vice-versa. As shown in FIG. 3A, when phi1 is low and phi2 is high, the "outer" switches 302A and 302D are closed, and the "inner" switches 302B and 302C are open. As shown in FIG. 3B, when the desired period (e.g., a clock cycle, clock half-cycle, etc.) elapses the values of the regulated signals phi1, phi2 flip; whereby phi1 is high and phi2 is low, the "outer" switches 302A and 302D are open, and the "inner" switches 302B and 302C are closed.

To illustrate how the current invention corrects the effect of tail current mismatch to gain error, it may be assumed that the tail current of $G_{m,IN}$, $I_{TAIL,IN}$ has a nominal value of $I_{TAIL}$, while the tail current of transconductor $G_{m,FB}$ suffers from a random mismatch denoted by δ such that its value is $I_{TAIL,FB} = I_{TAIL} \delta * I_{TAIL}$. During a first phase (phi1 low and phi2 high—see FIG. 3A) the "baseline" current $I_{TAIL}$ flows into the input transconductor $G_{m,IN}$ and the mismatched tail current $(1+\delta) * I_{TAIL}$ flows into the feedback transconductor $G_{m,FB}$. The transconductance of transistors $M_{1a}$ and $M_{1b}$, $g_{m1ab}$ will have a nominal value equal to $g_m$, while the transconductance of $M_{1c}$ and $M_{1d}$ will suffer from an equal mismatch, δ, $g_{m1cd} = g_m + \delta * g_m$; $G_{m,IN}$ will be equal to a nominal value Gm, while $G_{m,FB}$ will be approximately equal to $G_m(1+\delta)$. Therefore, during this phase, the gain error will be approximately −δ. Then in the second phase (phi1 high and phi2 low—see FIG. 3B) the modulator circuit 302 switches the tail current sources, and the baseline current $I_{TAIL}$ flows into the feedback transconductor $G_{m,FB}$ and the mismatched tail current $(1+\delta) * I_{TAIL}$ flows into the input transconductor $G_{m,IN}$. During this cycle, $G_{m,IN}$ will be $G_m(1+\delta)$, $G_{m,FB}$ will be equal to $G_m$, and the gain error will be approximately +δ. If during one half clock cycle, the gain error is −δ, and during the other half clock cycle +δ, over a complete clock cycle the gain error will be on average zero. Thus, the modulator circuit 302 provides a continuous correction of the gain error during CFIA 300 operation.

Additionally, various embodiments of the present CFIA architecture are suitable for high-voltage designs, even when the difference between common-mode voltages $V_{INP}$, $V_{INN}$, $V_{FBP}$, $V_{FBN}$ on the respective transconductors is large (e.g., over five (5) volts).

Figure 4:
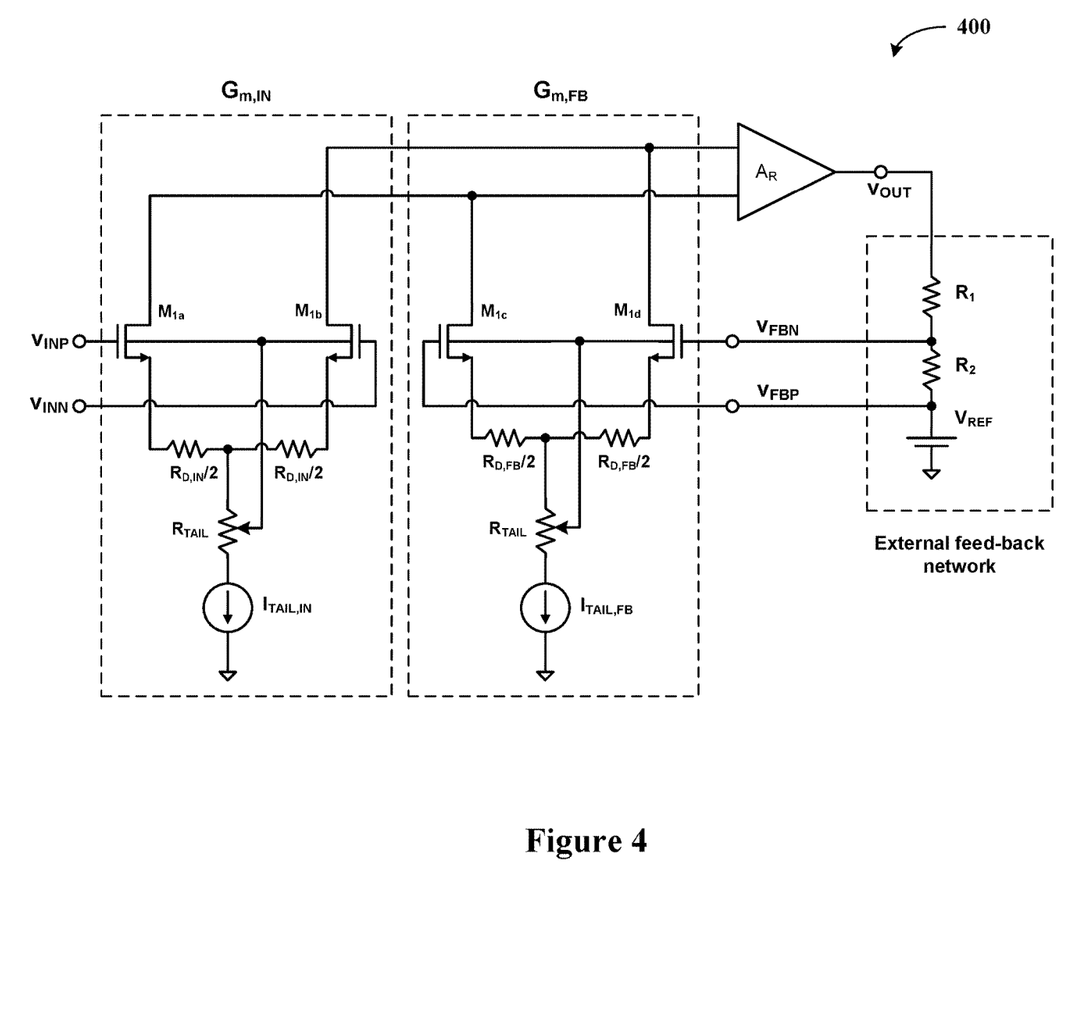
FIG. 4 illustrates a schematic diagram of a current-feedback instrumentation amplifier with a back-bias voltage trimming circuit, according to still another specific example embodiment of the present disclosure.

Referring to FIG. 4, depicted is a schematic diagram of a current-feedback instrumentation amplifier with a back-bias voltage trimming circuit, according to yet another specific example embodiment of the present disclosure. The CFIA 400 shown in FIG. 4 is configured and operates in substantially the same fashion as the CFIA 200 described hereinabove, but its architecture comprises N-channel MOSFETS instead of P-channel MOSFETS (FIG. 2).

The present invention has been described in terms of one or more preferred embodiments, and it should be appreciated that many equivalents, alternatives, variations, and modifications, aside from those expressly stated (e.g., methods of manufacturing, product by process, and so forth), are possible and within the scope of the invention.

What is claimed is:

1. A method for gain error correction in a current-feedback instrumentation amplifier, said method comprising the steps of:
   providing an input transconductor comprising
   a first differential pair of transistors,
   a first tail current source, and
   a first trimming circuit coupled between the first tail current source and the first differential pair of transistors, and to a bulk of the first differential pair of transistors,
   wherein the first trimming circuit varies a first back-bias voltage on the bulk of the first differential pair of transistors;
   providing a feedback transconductor comprising
   a second differential pair of transistors,
   a second tail current source, and
   a second trimming circuit coupled between the second tail current source and the second differential pair of transistors, and to a bulk of the second differential pair of transistors;
   wherein the second trimming circuit varies a second back-bias voltage on the bulk of the second differential pair of transistors; and
   adjusting the first and/or second trimming circuits to reduce gain error between the input transconductor and feedback transconductor.

2. The method according to claim 1, further comprising the steps of:
   providing first degeneration resistors coupled between the first differential pair of transistors and the first trimming circuit; and
   providing second degeneration resistors coupled between the second differential pair of transistors and the second trimming circuit.

3. The method according to claim 1, wherein the first and second trimming circuits comprise a plurality of series connected resistors and a plurality of switches coupled to the plurality of series connected resistors, whereby the first and second back-bias voltages are varied.

4. The method according to claim 3, further comprising the step of storing open and closed states of the plurality of switches in a non-volatile memory.

5. The method according to claim 1, further comprising the step of coupling the input and feedback transconductors to an amplifier.

6. The method according to claim 5, further comprising the steps of:
   coupling a feedback network between an output of the amplifier and inputs of the feedback transconductor; and
   determining the current-feedback instrumentation amplifier gain with the feedback network.

7. The method according to claim 1, further comprising the steps of:
   providing a modulator circuit between the first and second tail current sources, and the first and second trimming circuits;
   controlling the modulator circuit by alternating first and second phase states;
   wherein
   during the first phase state the modulator circuit couples the first tail current source to the first trimming circuit and the second tail current source to the second trimming circuit, and
   during the second phase state the modulator circuit couples the first tail current source to the second trimming circuit, and the second tail current source to the first trimming circuit.

8. A current-feedback instrumentation amplifier having gain error correction, comprising:
   an input transconductor comprising
   a first differential pair of transistors,
   a first tail current source, and
   a first trimming circuit coupled between the first tail current source and the first differential pair of transistors, and to a bulk of the first differential pair of transistors;
   wherein the first trimming circuit is configured to vary a first back-bias voltage on the bulk of the first differential pair of transistors;
   a feedback transconductor comprising
   a second differential pair of transistors,
   a second tail current source, and a second trimming circuit coupled between the second tail current source and the second differential pair of transistors, and to a bulk of the second differential pair of transistors;

wherein the second trimming circuit is configured to vary a second back-bias voltage on the bulk of the second differential pair of transistors; and the first and/or second trimming circuits are adapted to be adjusted to reduce gain error between the input transconductor and feedback transconductor.

9. The current-feedback instrumentation amplifier according to claim 8, further comprising:

first degeneration resistors coupled between the first differential pair of transistors and the first trimming circuit; and second degeneration resistors coupled between the second differential pair of transistors and the second trimming circuit.

10. The current-feedback instrumentation amplifier according to claim 8, wherein the first and second trimming circuits comprise a plurality of series connected resistors and a plurality of switches coupled to the plurality of series connected resistors, wherein the plurality of resistors and switches are adapted to vary the first and second back-bias voltages.

11. The current-feedback instrumentation amplifier according to claim 10, further comprising a non-volatile memory adapted for storing open and closed states of the plurality of switches.

12. The current-feedback instrumentation amplifier according to claim 8, further comprising an amplifier having inputs coupled to outputs from the input and feedback transconductors.

13. The current-feedback instrumentation amplifier according to claim 12, further comprising a feedback network coupled between an output of the amplifier and inputs of the feedback transconductor.

14. The current-feedback instrumentation amplifier according to claim 12, wherein the feedback network comprises:

a first feedback resistor;

a second feedback resistor; and a voltage reference;

wherein the first and second feedback resistors and the voltage reference are connected in series, a first input of the feedback transconductor is coupled to a node between the second feedback resistor and the voltage reference, a second input of the feedback transconductor is coupled to a node between the first feedback resistor and the second feedback resistor, and the output of the amplifier is coupled to the first feedback resistor;

wherein gain is determined by a ratio of resistance values of the first and second feedback resistors.

15. The current-feedback instrumentation amplifier according to claim 8, further comprising:

a modulator circuit coupled between the first and second tail current sources, and the first and second trimming circuits, wherein the modulator circuit is adapted to alternate between first and second phase states;

wherein during the first phase state the modulator circuit is adapted to couple the first tail current source to the first trimming circuit and the second tail current source to the second trimming circuit; and wherein during the second phase state the modulator circuit is adapted to couple the first tail current source to the second trimming circuit, and the second tail current source to the first trimming circuit.

16. The current-feedback instrumentation amplifier according to claim 15, wherein the modulator circuit comprises:

a first switch coupled between the first tail current source and the first degeneration resistors;

a second switch coupled between the first tail current source and the second degeneration resistors;

a third switch coupled between the second tail current source and the first degeneration resistors; and a fourth switch coupled between the second tail current source and the second degeneration resistors;

wherein the first and fourth switches are configured to close and the second and third switches are configured to open on a first phase state control signal; and the second and third switches are configured to close and the first and fourth switches are configured to open on a second phase state control signal.

17. The current-feedback instrumentation amplifier according to claim 16, wherein the first and second phase state control signals are from a clock generator, wherein the first phase state control signal is at a first logic level and the second phase state control signal is at a second logic level.

18. The current-feedback instrumentation amplifier according to claim 16, wherein the first, second, third and fourth switches are metal oxide semiconductor field effect transistors (MOSFETs).

19. The current-feedback instrumentation amplifier according to claim 8, wherein the input and feedback transconductors are fabricated on an integrated circuit die.

* * * * *